(12) United States Patent
Kulkarni et al.

(10) Patent No.: US 11,217,460 B2
(45) Date of Patent: Jan. 4, 2022

(54) MULTIPLE UNDERFILLS FOR FLIP CHIP PACKAGES

(71) Applicant: Texas Instruments Incorporated, Dallas, TX (US)

(72) Inventors: Makarand Ramkrishna Kulkarni, Dallas, TX (US); Tae Kim, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 139 days.

(21) Appl. No.: 15/975,167

(22) Filed: May 9, 2018

(65) Prior Publication Data

US 2019/0348303 A1 Nov. 14, 2019

(51) Int. Cl.
*H01L 21/56* (2006.01)
*H01L 23/31* (2006.01)
*H01L 23/00* (2006.01)

(52) U.S. Cl.
CPC ........ *H01L 21/563* (2013.01); *H01L 23/3114* (2013.01); *H01L 23/3121* (2013.01); *H01L 24/11* (2013.01); *H01L 24/27* (2013.01); *H01L 24/29* (2013.01); *H01L 24/32* (2013.01); *H01L 24/73* (2013.01); *H01L 2924/14* (2013.01)

(58) Field of Classification Search
CPC ....... H01L 21/563; H01L 24/73; H01L 24/32; H01L 24/27; H01L 24/11; H01L 24/29; H01L 23/3114; H01L 23/3121; H01L 2924/14; H01L 2224/29386; H01L 24/81; H01L 24/83; H01L 24/92; H01L 2224/81205; H01L 2224/81801; H01L 23/3135; H01L 24/17
See application file for complete search history.

(56) References Cited

U.S. PATENT DOCUMENTS

| | | | |
|---|---|---|---|
| 7,148,560 B2 | 12/2006 | Lee et al. | |
| 2003/0203536 A1 | 10/2003 | Dias | |
| 2006/0022328 A1* | 2/2006 | Lee | G06F 1/183 257/698 |
| 2007/0096336 A1* | 5/2007 | Lee | H01L 24/29 257/778 |
| 2007/0200234 A1* | 8/2007 | Gerber | H01L 21/563 257/734 |
| 2007/0201193 A1* | 8/2007 | Tsuji | H01L 23/49816 361/820 |

(Continued)

*Primary Examiner* — Charles D Garber
*Assistant Examiner* — S M Sohel Imtiaz
(74) *Attorney, Agent, or Firm* — Ronald O. Neerings; Charles A. Brill; Frank D. Cimino

(57) ABSTRACT

A method of assembling a flip chip IC package includes applying core underfill material to a surface of a package substrate in a pattern including an area corresponding to a core region of an IC die thereon that is to be attached, that excludes of an area corresponding to corners of the IC die. The IC die is bonded to the package substrate by pushing the IC die with a sufficient force for the core underfill material is displaced laterally by the bumps so that the bumps contact the land pads. After the pushing the corners of the IC die are not on the core underfill. Edge underfilling includes dispensing a second underfill material that is curable liquid to fill an area under the corners of the IC die. The second underfill material is cured resulting in it having a higher fracture strength as compared to the core underfill.

29 Claims, 4 Drawing Sheets

(56) References Cited

U.S. PATENT DOCUMENTS

| | | | | |
|---|---|---|---|---|
| 2008/0179738 A1* | 7/2008 | Nishimura | ............... | H01L 24/29 257/737 |
| 2009/0291524 A1* | 11/2009 | Takahashi | ............... | H01L 21/56 438/108 |
| 2009/0325348 A1* | 12/2009 | Gerber | ................... | C09J 163/00 438/120 |
| 2010/0044882 A1* | 2/2010 | Park | ...................... | H01L 21/563 257/778 |
| 2010/0164097 A1* | 7/2010 | Pendse | ................... | H01L 24/14 257/737 |
| 2010/0301493 A1* | 12/2010 | Gallegos | ............... | H01L 21/563 257/774 |
| 2011/0253428 A1* | 10/2011 | Lim | ....................... | H01L 23/16 174/255 |
| 2012/0070939 A1* | 3/2012 | Dunne | ................... | H01L 24/94 438/110 |
| 2013/0147052 A1* | 6/2013 | Zhang | .................... | H01L 24/05 257/774 |
| 2013/0196499 A1* | 8/2013 | Burgess | ................. | H01L 24/11 438/614 |
| 2013/0234313 A1* | 9/2013 | Wainerdi | ............. | H01L 23/373 257/706 |
| 2014/0145328 A1* | 5/2014 | Tummala | ................ | H01L 24/05 257/737 |
| 2016/0049345 A1* | 2/2016 | Brofman | ................. | H01L 24/83 257/676 |

\* cited by examiner

MULTIPLE UNDERFILLS FOR FLIP CHIP PACKAGES

FIELD

This Disclosure relates to flip chip packaging of integrated circuit (IC) devices.

BACKGROUND

In a flip chip on leadframe package assembly, a die having solder bumps on its bond pads is flipped onto the die pad of a leadframe, where the die is then bonded to die pad and is electrically coupled to the bond pads through re-flowing of the solder bump. Flip chip assemblies are favored where size savings are considered to be valuable. Flip chip technology can be used in conjunction with a variety of substrates, including ceramic substrates, printed wiring boards, flexible circuits, and silicon substrates. The solder bumps are typically located at the perimeter of the flip chip on electrically conductive bond pads that are interconnected with the circuitry on the chip. Because of the numerous functions typically performed by the micro circuitry of a chip, a relatively large number of solder bumps are often required.

The solder balls are then reflowed to prove a good electrical connection, typically using hot air reflow to provide a mounted chip. The mounted chip is then underfilled using a dielectric adhesive material, such as comprising epoxy. The underfill is intended to provide a stronger mechanical chip connection to the substrate, provide a heat bridge, and to ensure the solder joints are not stressed due to differential heating of the chip and the rest of the flip chip system. The underfill distributes the thermal expansion mismatch between the chip and the substrate, such as a board, helping to preventing stress concentration from developing in the solder joints which can lead to a premature failure.

SUMMARY

This Summary is provided to introduce a brief selection of disclosed concepts in a simplified form that are further described below in the Detailed Description including the drawings provided. This Summary is not intended to limit the claimed subject matter's scope.

This Disclosure recognizes for flip chip IC assemblies there is relatively high stress near the corners of the IC die, that there thus is a benefit from the underfill material selected to have high fracture strength. Fracture strength (or breaking strength) as known in physics is the stress when a specimen fails or fractures, the higher the better. A bump array or a ball grid array (BGA) across the IC die, especially for finer ball pitches, need underfill materials to also have good filling and flow properties to limit underfill voiding. It is thus recognized to be a challenge to find one underfill material and an underfill process that satisfies both of these generally mutually exclusive underfill material features.

Disclosed aspects provide an underfill arrangement that solves the problem of bump and underfill cracking at die corners particularly for relatively large IC die sizes that have relatively fine bump pitch such as less than 100 microns, and underfill voiding particularly for fine solder ball pitches, by using multiple underfill materials. The multiple underfill materials comprise a core underfill material and a second underfill material that have different respective material properties. Near the corners of the IC die, the corner underfill material has relatively high fracture strength and relatively strong adhesion to the IC die surface and substrate, while in the core region of the IC die away from the corners extending to the die center the core underfill material has relatively low fracture strength and relatively good flow properties.

A method of assembling a flip chip IC package includes applying core underfill material to a surface of a package substrate in a pattern including an area corresponding to a core region of an IC die thereon that is to be attached, that excludes an area corresponding to corners of the IC die. The IC die is bonded to the package substrate by pushing the IC die with a sufficient force for the core underfill material is displaced laterally by the bumps so that the bumps contact the land pads. After the pushing the corners of the IC die are not on the core underfill. Edge underfilling includes dispensing a second underfill material that is curable liquid to fill an area under the corners of the IC die. The second underfill material is cured resulting in it having a higher fracture strength as compared to the core underfill.

BRIEF DESCRIPTION OF THE DRAWINGS

Reference will now be made to the accompanying drawings, which are not necessarily drawn to scale, wherein.

DETAILED DESCRIPTION

Figure 1:
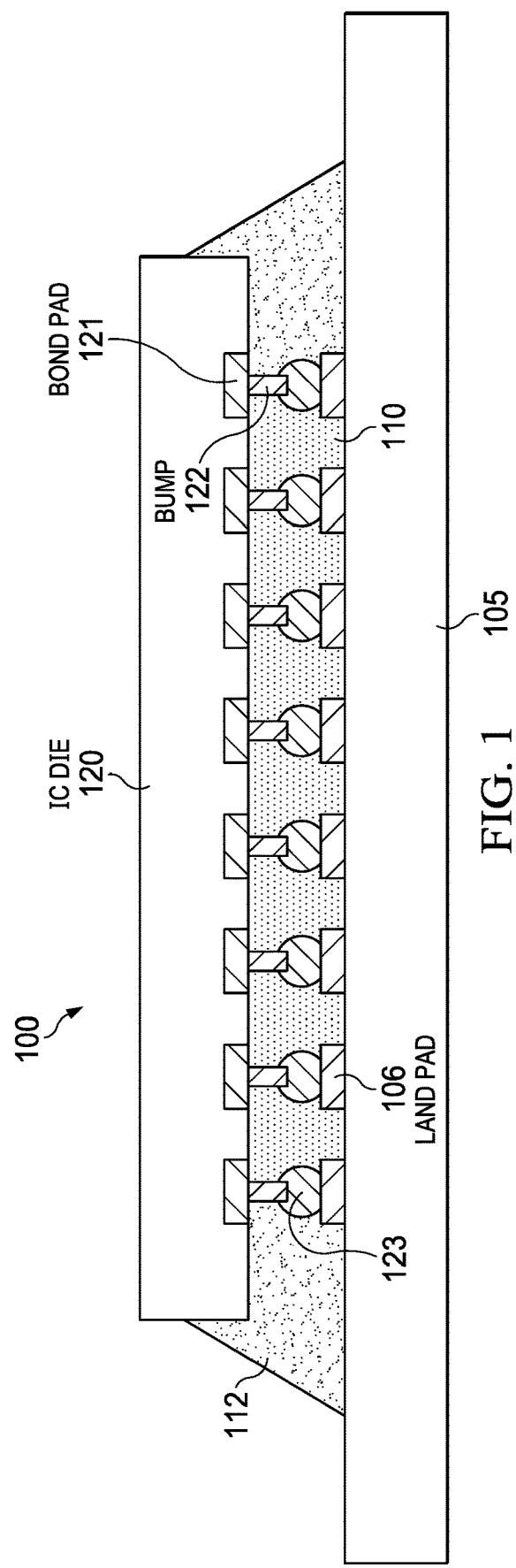
FIG. 1 is cross-sectional view of a portion of an example flip chip package having multiple underfills between an IC die and a package substrate.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Figure 2A:
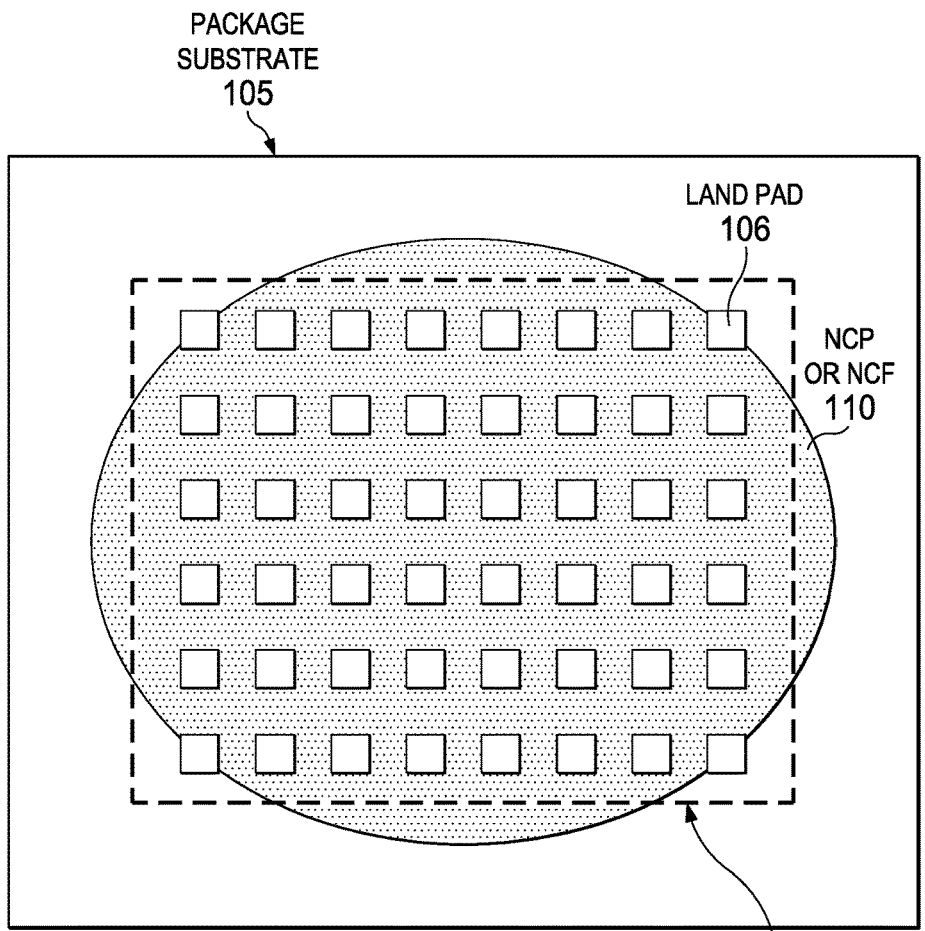
FIG. 2A is a top perspective view of a package substrate having a surface with a plurality of land pads thereon and a core underfill material shown comprising a non-conductive paste (NCP) or a Non-Conductive Film (NCF) in a pattern that covers regions of the surface including an area corresponding to the core region of an IC die to be attached thereto, but the core underfill material is not in an outer area corresponding to a corner corners of IC die to be attached.
Figure 2B:
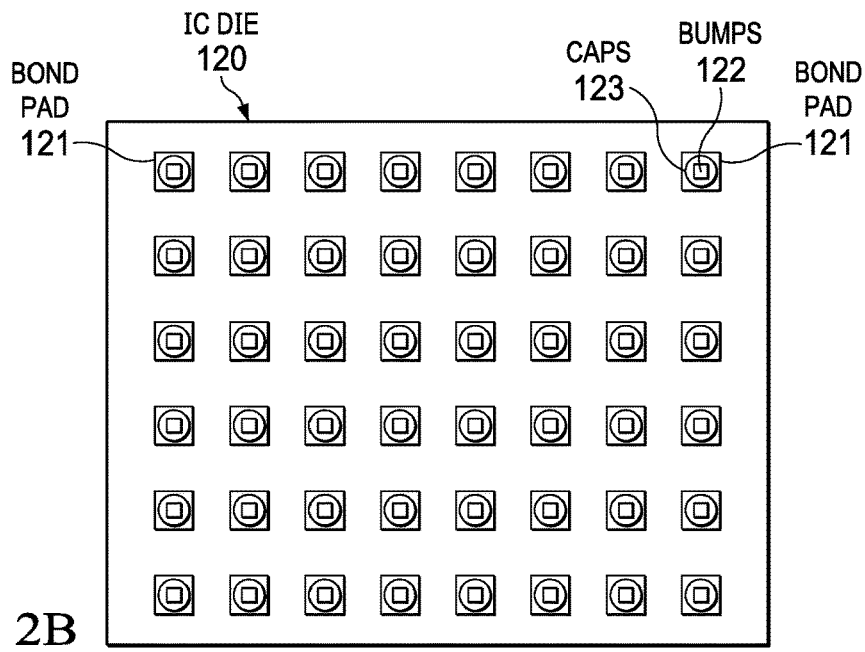
FIG. 2B is a top perspective view of the IC die referenced in FIG. 2A that is to be attached to the package substrate in FIG. 2A.
Figure 2C:
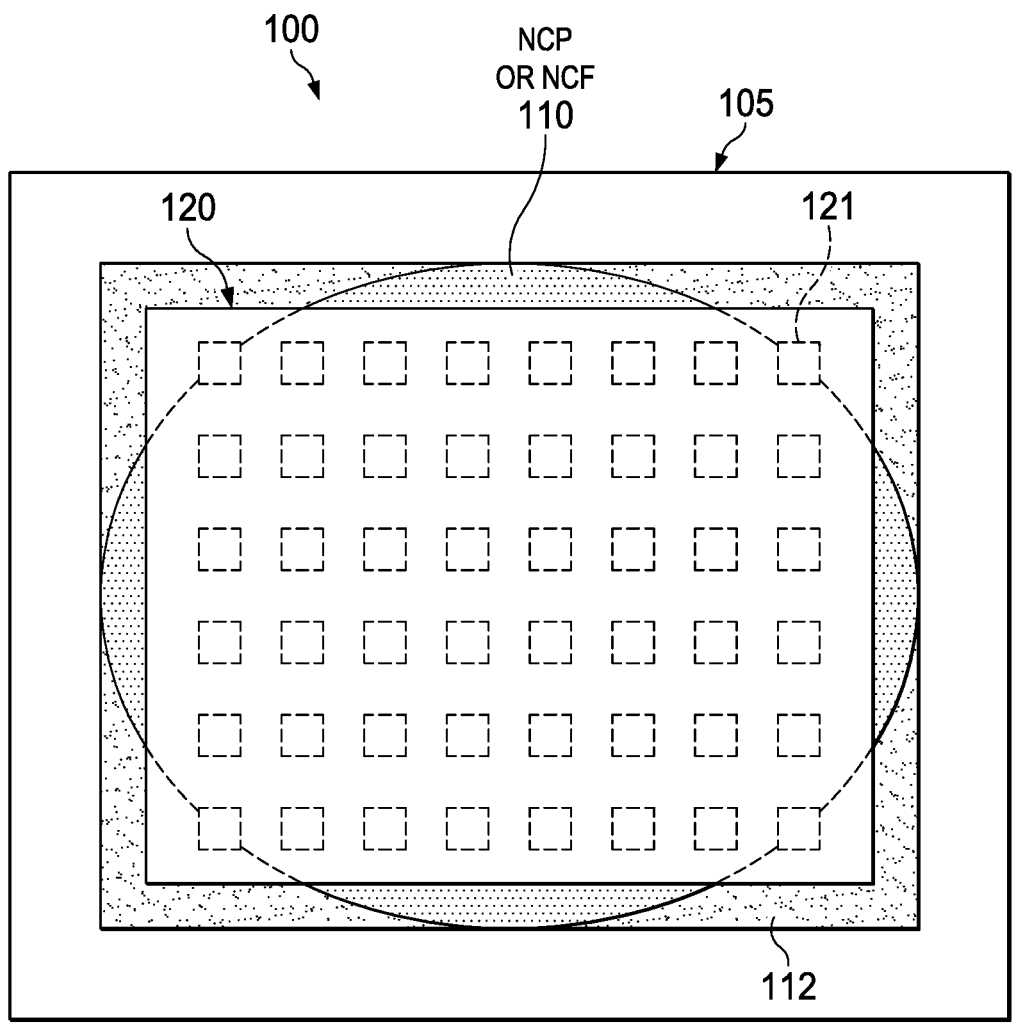
FIG. 2C is a top perspective view of a flip chip package with multiple underfills provided after the IC die in FIG. 2B is attached to the package substrate shown in FIG. 2A.

FIG. 1 is cross-sectional view of a portion of the flip chip IC package 100 having multiple underfills also shown in a top perspective view in FIG. 2C. The flip chip package 100 includes an IC die 120 having bumps 122 with optional solder caps 123 coupled to bond pads 121 on a top surface of the IC die 120 that includes corners and a core region including a center of the die away from the corners. The IC die 120 includes functional circuitry that realizes and carries out a desired functionality, such as that of a digital IC (e.g., digital signal processor) or analog IC (e.g., amplifier or power converter), and in one embodiment a BiCMOS (MOS and Bipolar) IC. The capability of functional circuitry provided on a disclosed IC may vary, for example ranging from a simple device to a complex device. The specific functionality contained within functional circuitry is not of importance to disclosed aspects.

The flip chip package 100 includes a package substrate 105 that has a package surface with a plurality of land pads 106 thereon. The package substrate can be a printed circuit board (PCB), leadframe, or another IC die.

The solder caps 123 on the bumps 122 are attached to the plurality of land pads 106. The bumps 122 can comprise copper pillars. The solder for the solder caps 123 can be screen printed on the bond pads 121, or plated on the bumps 122. The bumps 122 can comprise copper, gold, or a combination of materials. A core underfill material 110 is between the IC die 120 and the package substrate 105 under the IC die 120 in the core region including the center of the IC die but not under the corners of the IC die. The core underfill 110 can comprise a NCP or a NCF, so that the core underfill material 110 is not a liquid when applied, such as by applying a conventional epoxy resin. A second underfill material 112 is between the IC die 120 and the package substrate 105 under the corners of the IC die 120.

The second underfill comprises a second composition having a higher fracture strength as compared to a fracture strength of the core underfill material 110. An adhesive strength refers to the strength of the adhesive bond provided, conventionally measured as a force required to separate two objects of standard bonded area, by either shear or tensile stress. The fracture strength of the second underfill material 112 (after curing) is generally at least 50% greater as compared to the fracture strength of the core underfill material 110.

The second underfill material 112 is selected to withstand the stress at die corners. The stress at the corners depends on the die size, package size, substrate properties (such as coefficient of thermal expansion) for the package substrate and for the IC die, the underfill, as well as use conditions (e.g., the temperature range) in the particular application.

It is recognized NCF underfills, applied as a film laminated to a wafer, offer significant advantages over conventional capillary underfills and other underfill technologies for fine pitch designs. Because NCF is applied using a lamination process to wafers prior to dicing, handling and dispensing of resins can be eliminated from the assembly process. Additionally, the lamination of NCFs allows for a precise, uniform placement of underfill. Since NCF is applied at the beginning of the assembly process, it is able to support thinned die after backgrinding.

NCPs are pre-applied to package substrates and can use a thermal compression bonding process (TCB). For devices where pitches are less than about 100 μm and gaps are less than about 40 μm, traditional capillary underfills are challenged. Because capillary action is driven by the gap distance and the vacuum action within the gap, new flip-chip constructions such as copper (Cu) pillar can limit capillary underfill's ability to flow within the high-density dimensions, which may result in reduced reliability. To overcome these issues, one can use TCB with NCP materials. For example, one NCP material is LOCTITE ECCOBOND NCP 5209 which can be pre-applied onto the package substrate, facilitating bump protection and interconnection in a single step.

For disclosed packages dam structures are not needed. This is because core underfill materials such as comprising a NCP or NCF is used under the IC die 120. Flow of these types of underfill materials can be controlled to stay within bump area of the die (i.e. not flow to the die corners). Also, these materials are applied on the package substrate 105 prior to die attach.

FIG. 2A is a top perspective view of a package substrate 105 having a surface with a plurality of land pads 106 thereon and a core underfill material 110 comprising a NCP or NCF in a pattern that covers regions of its surface including a die attach area 105a corresponding to the core region of an IC die to be attached thereto but not in an outer area corresponding to a corner or corners of an IC die to be attached. FIG. 2B is a top perspective view of the IC die 120 referenced in FIG. 2A that is to be attached to the package substrate 105 in FIG. 2A.

Figure 2D:
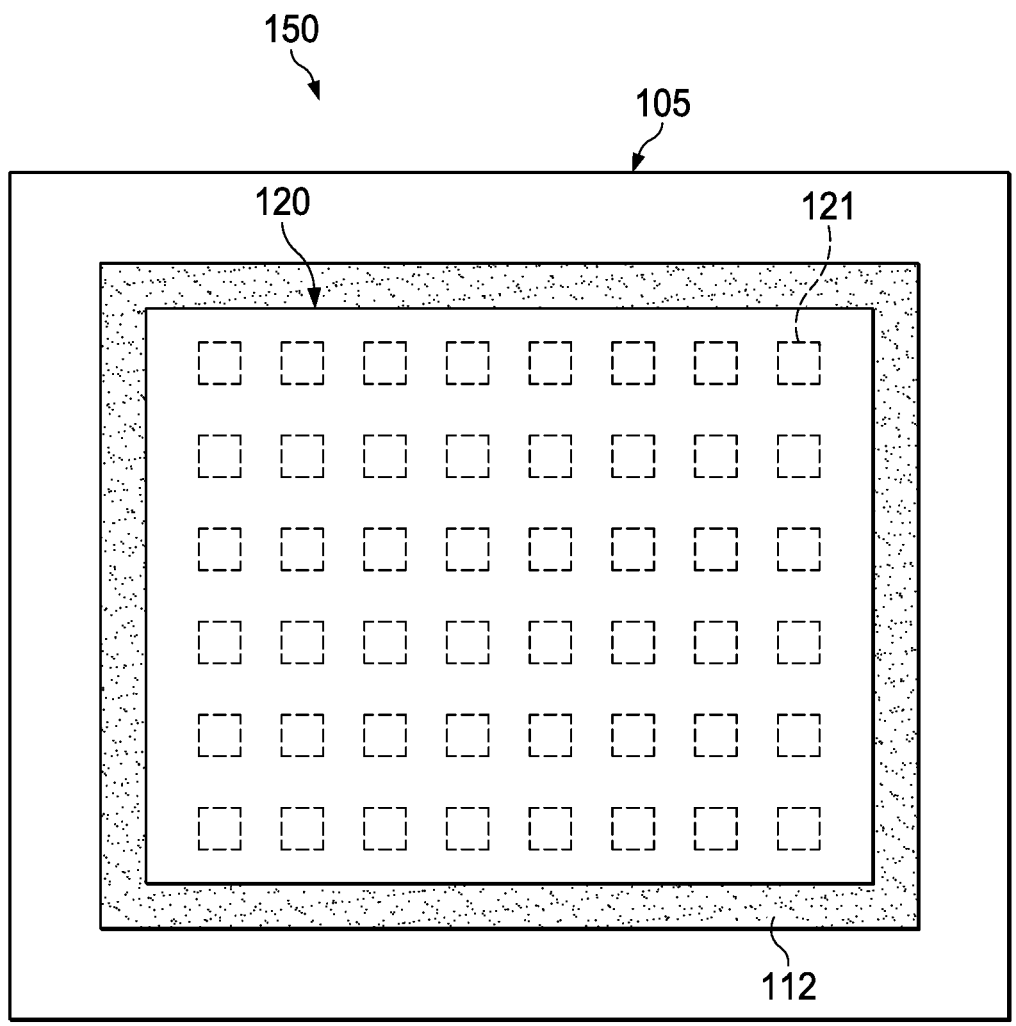
FIG. 2D is a top perspective view of a flip chip package with multiple underfills provided after the IC die in FIG. 2B is attached to the package substrate shown in FIG. 2A with the processing modified so that the core underfill on the package substrate 105 is changed so that it is contained under the IC die instead of being outside along the IC die edges as shown in FIG. 2C.

FIG. 2C is a top perspective view of flip chip package with multiple underfills 110, 112, underfill 112 being provided after the IC die 120 in FIG. 2B is attached to the package substrate 105 shown in FIG. 2A and the second underfill material 112 is then added. FIG. 2D is a top perspective view of a flip chip package with multiple underfills 150 provided after the IC die in FIG. 2B is attached to the package substrate shown in FIG. 2A modified so that the core underfill 110 is contained under the IC die 120 instead of flowing outside along the IC die edges shown in FIG. 2C. The area of the core underfill material 110 shown in FIG. 2C extending beyond the IC die can be occupied by the second underfill material 112, thus being the same material that is at die corners.

Disclosed aspects also include a method of assembling a flip chip IC package 100. The method comprises applying to a surface of a package substrate 105 having a plurality of land pads 106 thereon a core underfill material 110 in a pattern that covers regions of the surface including an area corresponding to a core region of an IC die 120 having bumps 122 with optional solder caps 123 coupled to bond pads 121 thereon that is to be attached to the land pads. The pattern excludes an area of the surface corresponding to corners of the IC die 120. After the applying, the IC die 120 is inverted and then flip chip bonded to the package substrate by pushing the IC die 120 down towards the package substrate 105 with a sufficient force for the core underfill material 110 to be displaced laterally by the bumps 122 so that the bumps 122 reach through to electrically contact the land pads 106. Thus, when the IC die 120 with its bumps 122 is pushed down, the core underfill material 110 gives way to the bumps 122 so that the bumps 122 pierce through the core underfill material 110 to reach the land pads 106. After the pushing all the corners of the IC die 120 are not on the core underfill material 110.

The method then comprises edge underfilling comprising dispensing a second underfill material 112 comprising a curable liquid, typically an epoxy resin, after the attaching to fill an area including under the corners of the IC die 120. The second underfill material is then cured. After the curing the second underfill has a higher fracture strength as compared to a fracture strength of the core underfill material.

As disclosed above, the core underfill material 110 can comprises an NCF, wherein the applying comprises applying the NCF as a film laminate. The core underfill material 110 can also comprise a NCP, typically applied by dispensing a paste on the substrate using a capillary. The core underfill material 110 is thus not a liquid when applied like a conventional epoxy. The applying the core underfill material comprises controlling the shape and location of the core underfill material. The NCF shape and location are typically controlled by cutting or patterning the film and then aligning it to the appropriate location on the substrate during lamination. The NCP shape and location are typically controlled by adjusting the capillary size, shape, and the dispense pattern.

The bonding in the case of solder can further comprise reflowing the bumps after the pushing and before the edge underfilling. The reflow temperature can be 260 to 320° C., for several second to 10s of minutes. The bonding can also comprise ultrasonic bonding, or TCB, which may or may not involve a reflow.

Advantages of disclosed aspects include no dams are not required at the corners of the IC die 120. This lower the cost, lower the complexity, end provides more board/substrate space available for bumps/routing. Moreover, since the core underfill material 110 (e.g., NCP/NCF) is applied to the package substrate 105 before die attach, it is easier to fill the spaces between bumps without voids and hence applicable to narrow bump to bump spaces.

Advantages of disclosed aspects include relatively easy implementation in existing package structure with known performance (substrate material, thickness, die thickness, etc.). Disclosed aspects extend the capability to finer pitch on larger die sizes. For system on a chip (SOC), more and more functionality on die creates a need for larger die with finer pitch (e.g., for 16 nm CMOS and beyond), that disclosed aspects can provided.

Disclosed embodiments can be integrated into a variety of assembly flows to form a variety of different package devices and related products. The assembly can comprise single semiconductor die or multiple semiconductor die, such as PoP configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this Disclosure.

The invention claimed is:

1. A method of assembling a flip chip integrated circuit (IC) package, comprising:
applying to a surface of a package substrate having a plurality of land pads thereon a core underfill material in a pattern that covers regions of the surface including an area corresponding to a core region of an IC die having bumps coupled to bond pads thereon that is to be attached to the land pads, where the pattern excludes an area of the surface corresponding to corners of the IC die;
after the applying, bonding the IC die to the package substrate comprises pushing the IC die down towards the package substrate with a sufficient force for the core underfill material to be displaced laterally by the bumps so that the bumps reach through to contact the land pads, wherein after the pushing,. all the corners of the IC die are not on the core underfill material;
edge underfilling comprising dispensing a second underfill material comprising a curable liquid after the attaching to fill an area including under the corners of the IC die; and
curing the second underfill material, wherein the second underfill after the curing has a higher fracture strength as compared to a fracture strength of the core underfill material.

2. The method of claim 1, wherein the core underfill material comprises a Non-Conductive Film (NCF), and wherein the applying comprises applying the NCF as a film laminate.

3. The method of claim 2, wherein the applying the NCF comprises controlling a shape and location by pre-patterning the NCF and aligning it to at least one predetermined location.

4. The method of claim 1, wherein the core underfill material comprises a non-conductive paste (NCP), and wherein the applying comprises applying the NCP using a capillary.

5. The method of claim 1, wherein the package substrate comprises a printed circuit board (PCB), a lead frame, or another IC die.

6. The method of claim 1, wherein the bumps comprise solder capped copper pillars.

7. The method of claim 1, wherein the core underfill material does not extend beyond the IC die.

8. The method of claim 1, wherein the second underfill material comprises an epoxy.

9. A method of assembling a flip chip integrated circuit (IC) package, comprising:
applying to a surface of a package substrate having a plurality of land pads thereon a core underfill material in a pattern that covers regions of the surface including an area corresponding to a core region of an IC die having bumps coupled to bond pads thereon that is to be attached to the land pads, where the pattern excludes an area of the surface corresponding to corners of the IC die and wherein the core underfill material comprises a non-conductive paste (NCP), wherein the applying comprises applying the NCP using a capillary and wherein the applying the NCP comprises adjusting a capillary size, shape, and a dispense pattern;
after the applying, bonding the IC die to the package substrate comprises pushing the IC die down towards the package substrate with a sufficient force for the core underfill material to be displaced laterally by the bumps so that the bumps reach through to contact the land pads, wherein after the pushing all the corners of the IC die are not on the core underfill material;
edge underfilling comprising dispensing a second underfill material comprising a curable liquid after the attaching to fill an area including under the corners of the IC die; and
curing the second underfill material, wherein the second underfill after the curing has a higher fracture strength as compared to a fracture strength of the core underfill material.

10. A method of assembling a flip chip integrated circuit (IC) package, comprising:
applying to a surface of a package substrate having a plurality of land pads thereon a core underfill material in a pattern that covers regions of the surface including an area corresponding to a core region of an IC die having bumps coupled to bond pads thereon that is to be attached to the land pads, where the pattern excludes an area of the surface corresponding to corners of the IC die;

after the applying, bonding the IC die to the package substrate comprises pushing the IC die down towards the package substrate with a sufficient force for the core underfill material to be displaced laterally by the bumps so that the bumps reach through to contact the land pads, wherein after the pushing all the corners of the IC die are not on the core underfill material and wherein the bonding further comprises reflowing the bumps after the pushing and before the edge underfilling;

edge underfilling comprising dispensing a second underfill material comprising a curable liquid after the attaching to fill an area including under the corners of the IC die; and curing the second underfill material, wherein the second underfill after the curing has a higher fracture strength as compared to a fracture strength of the core underfill material.

11. A method of assembling a flip chip integrated circuit (IC) package, comprising:

applying to a surface of a package substrate having a plurality of land pads thereon a core underfill material in a pattern that covers regions of the surface including an area corresponding to a core region of an IC die having bumps coupled to bond pads thereon that is to be attached to the land pads, where the pattern excludes an area of the surface corresponding to corners of the IC die;

after the applying, ultrasonic bonding the IC die to the package substrate comprises pushing the IC die down towards the package substrate with a sufficient force for the core underfill material to be displaced laterally by the bumps so that the bumps reach through to contact the land pads, wherein after the pushing all the corners of the IC die are not on the core underfill material;

edge underfilling comprising dispensing a second underfill material comprising a curable liquid after the attaching to fill an area including under the corners of the IC die; and curing the second underfill material, wherein the second underfill after the curing has a higher fracture strength as compared to a fracture strength of the core underfill material.

12. A method of assembling a flip chip integrated circuit (IC) package, comprising:

applying to a surface of a package substrate having a plurality of land pads thereon a core underfill material in a pattern that covers regions of the surface including an area corresponding to a core region of an IC die having bumps coupled to bond pads thereon that is to be attached to the land pads, where the pattern excludes an area of the surface corresponding to corners of the IC die;

after the applying, bonding the IC die to the package substrate comprises pushing the IC die down towards the package substrate with a sufficient force for the core underfill material to be displaced laterally by the bumps so that the bumps reach through to contact the land pads, wherein after the pushing all the corners of the IC die are not on the core underfill material;

edge underfilling comprising dispensing a second underfill material comprising a curable liquid after the attaching to fill an area including under the corners of the IC die, and curing the second underfill material, wherein the second underfill after the curing has at least 50% greater fracture strength as compared to a fracture strength of the core underfill material.

13. A method of assembling a flip chip integrated circuit (IC) package, comprising:

applying to a surface of a package substrate having a plurality of land pads thereon a core underfill material in a pattern that covers regions of the surface including an area corresponding to a core region of an IC die having bumps coupled to bond pads thereon that is to be attached to the land pads, where the pattern excludes an area of the surface corresponding to corners of the IC die, wherein the core underfill material extends beyond the IC die away from the corners of the IC die;

after the applying, bonding the IC die to the package substrate comprises pushing the IC die down towards the package substrate with a sufficient force for the core underfill material to be displaced laterally by the bumps so that the bumps reach through to contact the land pads, wherein after the pushing all the corners of the IC die are not on the core underfill material;

edge underfilling comprising dispensing a second underfill material comprising a curable liquid after the attaching to fill an area including under the corners of the IC die, and curing the second underfill material, wherein the second underfill after the curing has at least 50% greater fracture strength as compared to a fracture strength of the core underfill material.

14. A flip chip integrated circuit (IC) package, comprising:

an IC die having bumps coupled to bond pads on a top surface of the IC die that includes corners and a core region including a center of the die away from the corners;

a package substrate having a package surface with a plurality of land pads thereon;

wherein the bumps are attached to the plurality of land pads;

a core underfill material between the IC die and package substrate under the IC die in the core region but not under the corners, and a second underfill material between the IC die and package substrate under the corners of the IC die comprising a second composition, wherein the second underfill has a fracture strength at least 50% greater as compared to the fracture strength of the core underfill material.

15. The flip chip IC package of claim 14, wherein the core underfill material comprises a Non-Conductive Film (NCF).

16. The flip chip IC package of claim 14, wherein the core underfill material comprises a non-conductive paste (NCP).

17. The flip chip IC package of claim 14, wherein the package substrate comprises a printed circuit board (PCB), a lead frame, or another IC die.

18. The flip chip IC package of claim 14, wherein the copper pillars comprise solder capped copper pillars.

19. The flip chip IC package of claim 14, wherein the second underfill material comprises an epoxy.

20. A method of assembling a flip chip integrated circuit (IC) package, comprising:

applying to a surface of a package substrate having a plurality of land pads thereon a core underfill material in a pattern that excludes an area of the surface corresponding to corners of an IC die;

bonding the IC die to the package substrate such that all the corners of the IC die are not on the core underfill material, wherein the bonding comprises ultrasonic bonding;

dispensing a second underfill material under the corners of the IC die; and curing the second underfill material, wherein the second underfill after the curing has a higher fracture strength as compared to a fracture strength of the core underfill material.

21. The method of claim 20, wherein the core underfill material comprises a Non-Conductive Film (NCF), and wherein the applying comprises applying the NCF as a film laminate.

22. The method of claim 20, wherein the applying the NCF comprises controlling a shape and location by pre-patterning the NCF and aligning it to at least one predetermined location.

23. The method of claim 20, wherein the core underfill material comprises a non-conductive paste (NCP), and wherein the applying comprises applying the NCP using a capillary.

24. The method of claim 20, wherein the package substrate comprises a printed circuit board (PCB), a lead frame, or another IC die.

25. A method of assembling a flip chip integrated circuit (IC) package, comprising:

applying to a surface of a package substrate having a plurality of land pads thereon a core underfill material in a pattern that excludes an area of the surface corresponding to corners of the IC die, wherein the core underfill material comprises a non-conductive paste (NCP), wherein the applying comprises applying the NCP using a capillary, and wherein the applying the NCP comprises adjusting a capillary size, shape, and a dispense pattern;

bonding an IC die to the package substrate such that all the corners of the IC die are not on the core underfill material;

dispensing a second underfill material under the corners of the IC die; and curing the second underfill material, wherein the second underfill after the curing has a higher fracture strength as compared to a fracture strength of the core underfill material.

26. A method of assembling a flip chip integrated circuit (IC) package, comprising:

applying to a surface of a package substrate having a plurality of land pads thereon a core underfill material in a pattern that excludes an area of the surface corresponding to corners of an IC die;

bonding the IC die to the package substrate such that all the corners of the IC die are not on the core underfill material;

dispensing a second underfill material under the corners of the IC die, and curing the second underfill material, wherein the second underfill after the curing has at least 50% greater fracture strength as compared to a fracture strength of the core underfill material.

27. The method of claim 26, wherein the core underfill material does not extend beyond the IC die.

28. The method of claim 26, wherein the second underfill material comprises an epoxy.

29. A method of assembling a flip chip integrated circuit (IC) package, comprising:

applying to a surface of a package substrate having a plurality of land pads thereon a core underfill material in a pattern that excludes an area of the surface corresponding to corners of an IC die, wherein the core underfill material extends beyond the IC die away from the corners of the IC die;

bonding the IC die to the package substrate such that all the corners of the IC die are not on the core underfill material;

dispensing a second underfill material under the corners of the IC die, and curing the second underfill material, wherein the second underfill after the curing has at least 50% greater fracture strength as compared to a fracture strength of the core underfill material.

* * * * *